250/201

572,452

Feb. 3, 1970 B. BRIGHTMAN 3,493,761

BI-STABLE ELECTRO-OPTICAL SWITCHING CIRCUIT

Filed Aug. 15, 1966

INVENTOR.
BARRIE BRIGHTMAN

BY H. Hal Stone

ATTORNEY

United States Patent Office 3,493,761
Patented Feb. 3, 1970

3,493,761

BI-STABLE ELECTRO-OPTICAL SWITCHING CIRCUIT

Barrie Brightman, Webster, N.Y., assignor to Stromberg-Carlson Corporation, Rochester, N.Y., a corporation of Delaware Filed Aug. 15, 1966, Ser. No. 572,452
Int. Cl. G01j *1/20*
U.S. Cl. 250—201 6 Claims

ABSTRACT OF THE DISCLOSURE

A bi-stable electro-optical circuit is disclosed which includes an electrically energizable radiation source connected in a series circuit with a radiation sensitive impedance device. In absence of continuous radiation from the source, the impedance device exhibits a high impedance to current flow and maintains the series circuit non-conductive. An electrical circuit is coupled to the series circuit to apply electrical signals to switch the series circuit between its conductive and non-conductive states.

This invention relates to a novel bi-stable oscillator of relatively simple and inexpensive construction suitable for many different utilizations such as, for example, storing electrical signals.

The circuit of the invention is very simple, and includes only a relatively small number of components, yet it can be easily designed for high speed operation.

Briefly, in accordance with the broad concept of the invention, a bi-stable circuit includes simply an electrically energizable radiation source, a radiation sensitive impedance device electrically in series with the source and arranged for receiving radiation from it, and means for alternately momentarily energizing and de-energizing the source. Radiant coupling from the source to the impedance device constitutes a positive feed-back path so that the circuit remains in either one of its two stable states until it is disturbed by an applied signal.

Figure 1:
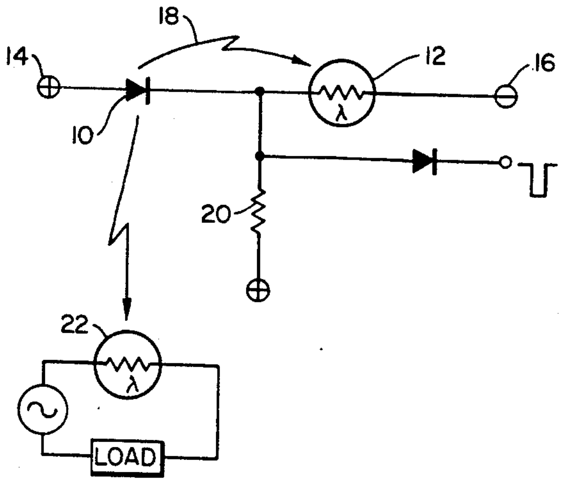
Figure 2:
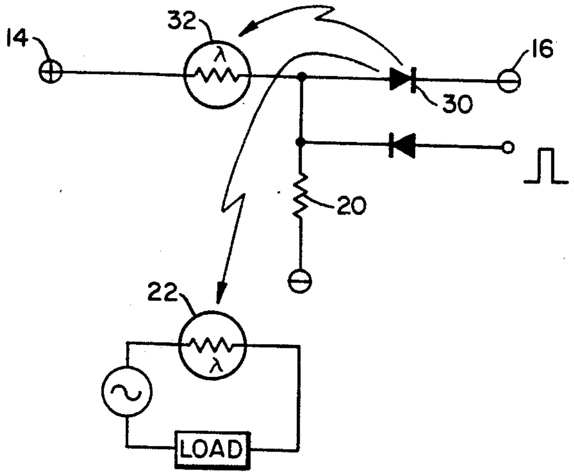

Representative embodiments of the invention will now be described in connection with the accompanying drawing, wherein FIGURES 1 and 2 are schematic circuit diagrams of two representative circuits according to the invention.

Referring first to FIGURE 1, a circuit according to a first embodiment of the invention includes a radiation source 10, which may be, as shown, a semi-conductor device of the type known as an injection laser, or light emitting diode (LED). A photoconductor 12 is connected in series with the LED 10 between the terminals 14 and 16 of a D.C. power supply (not shown) and, as indicated by the jagged arrow 18, is mounted for receiving radiation from the LED. Preferably, the photoconductor 12 is shielded from extraneous radiation to avoid the possibility of spurious action. A ballast resistor 20 shunts the LED 10 to back bias the LED 10 and to provide dark current for the photo-conductor 12, thereby to insure stability of the circuit while it is in its OFF condition, that is, during times when the LED 10 is not radiating. The circuit is triggered from its OFF to its ON condition by application of a negative going electrical pulse at the cathode of the LED 10. The pulse causes the LED 10 to conduct current and to radiate. Radiation from the LED reduces the resistance of the photoconductor 12 to the point where a major portion of the voltage drop between the terminals 14 and 16 appears across the LED 10 keeping it constantly energized.

The circuit may be switched to its OFF condition either by interrupting the power source, or by applying a positive going pulse from a relatively low impedance source to the cathode of the LED 10.

The output signal from the circuit may be constituted by the voltage appearing at the cathode of the LED 10. When the circuit is in its OFF condition, the potential at this point is more positive than when the circuit is in its ON condition. Alternatively, radiation from the LED 10 may constitute the output signal of the circuit, in which case a second photoconductor 22 is mounted in radiation receiving relationship to the LED 10 and connected in a utilization circuit for controlling the flow of current to a load device. In this latter case, the circuit is well suited for controlling the operation of A.C. as well as D.C. circuits.

The circuit shown in FIGURE 2 is generally similar to the circuit illustrated in FIGURE 1, except that the positions of the LED 30 and the photoconductor 32 are reversed relative to the terminals 14 and 16 of the power source. In the embodiment shown in FIGURE 1, the anode of the LED 10 is connected to the positive terminal 14, and the photoconductor 12 is connected between the cathode of the LED and the negative terminal 16. In the embodiment shown in FIGURE 2, the cathode of the LED 30 is connected to the negative terminal 16 and the photoconductor 32 is connected between the anode of the LED and the positive terminal 14. Operation of this circuit is generally similar to the operation of the circuit shown in FIGURE 1, except that the circuit of FIGURE 2 is triggered from its OFF to its ON condition by the application of a positive going pulse at the anode of the LED 30, and is triggered OFF by a negative going pulse at the anode, or by interruption of the power supply.

It will be appreciated that the circuits of the invention may be triggered optically as well as electrically from their OFF to their ON condition simply by momentarily applying a radiation signal to the photoconductors 12 or 32. In the usual case, however, it is believed that electrical triggering will be more convenient.

What is claimed is:

1. A bi-stable electro-optical device comprising an electrically energizable radiation source, first and second impedance devices sensitive to and mounted for receiving radiation from said source, means for connecting said source and said first impedance device in a series circuit between output terminals of a source of electricity, means for connecting said second impedance device in a utilization circuit separate from said series circuit, the impedances of said devices in the absence of continuous radiation from said radiation source being sufficient to impede current flow to a value below that at which said radiation source produces a significant radiation, radiation from said radiation source being effective to reduce the impedance of said devices to a value enabling current to flow in said series circuit and in said utilization circuit, said current in said series circuit being sufficient to energize said radiation source, and circuit means coupled to said series circuit for applying an electrical switching signal to said radiation source to momentarily enable sufficient current flow through said radiation source for energizing said radiation source and thereby rendering said series circuit and said utilization circuit conductive and for applying an electrical switching signal to said series circuit to momentarily reduce the current flow through said radiation source to de-energize said radiation source and thereby render said series circuit and said utilization circuit nonconductive.

2. A bi-stable electro-optical device according to claim 1 and further including means shunting said radiation source to provide dark current for said impedance device.

3. A bi-stable electro-optical device according to claim 1 wherein said radiation source is a light source and said impedance device is a photoconductor.

4. A bi-stable electro-optical device according to claim 3 wherein said light source is an injection laser.

5. A bi-stable electro-optical device as defined in claim 1 wherein said radiation source is a unidirectional current conduction device, circuit means is coupled to said series circuit between said unidirectional current conduction device and said impedance device for applying a back-biasing potential to said unidirectional current conduction device and providing a dark current path for said impedance device when said series circuit is non-conductive, and wherein said switching signal applied to said unidirectional current conduction device momentarily overcomes said back-biasing potential and renders said series circuit conductive.

6. A bi-stable electro-optical switching circuit comprising:

first and second radiation sensitive devices each exhibiting an impedance inversely related to the amount of radiation received;

a radiation emitting diode for emitting radiation when energized;

means for mounting said first and second radiation sensitive devices for receiving radiation from said diode;

a pair of terminals for connection to a direct current power source;

circuit means for connecting said first radiation sensitive device and said diode in a first series circuit between said pair of terminals so that said first series circuit is conductive while said diode emits radiation and is nonconductive in absence of radiation from said diode;

circuit means for applying a potential to the junction of said diode and said first radiation sensitive device to provide a back-biasing potential to said diode and a dark current path for said first radiation sensitive device when said series circuit is nonconductive.

circuit means coupled to said first series circuit for applying an electrical switching signal to said radiation source to momentarily overcome said back-biasing potential to enable sufficient current flow through said radiation source for energizing said radiation source and thereby rendering said first series circuit conductive and for applying an electrical switching signal to said first series circuit to momentarily reduce the current flow through said radiation source to de-energize said radiation source and thereby render said first series circuit nonconductive;

a source of signals;

an output circuit, and circuit means connecting said source of signals, said output circuit and said second radiation sensitive dedice in a second series circuit so that signals from said signal source are applied to said output circuit when said first series circuit is conductive.

References Cited

UNITED STATES PATENTS

| | | | |
|---|---|---|---|
| 3,051,840 | 8/1962 | Davis | 307—311 X |
| 3,254,267 | 5/1966 | Sack | 307—211 X |
| 3,321,632 | 5/1967 | Wood | 250—206 X |
| 3,366,793 | 1/1968 | Svedberg | 307—311 X |

JAMES W. LAWRENCE, Primary Examiner

C. R. CAMPBELL, Assistant Examiner

U.S. Cl. X.R.

250—205, 206, 208; 307—311; 315—151, 159